(12) United States Patent
Sakai

(10) Patent No.: US 6,616,816 B2
(45) Date of Patent: Sep. 9, 2003

(54) SUBSTRATE PROCESSING DEVICE AND METHOD

(75) Inventor: Junro Sakai, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/917,673

(22) Filed: Jul. 31, 2001

(65) Prior Publication Data

US 2002/0017910 A1 Feb. 14, 2002

(30) Foreign Application Priority Data

Aug. 1, 2000 (JP) ........................ 2000-233593

(51) Int. Cl.⁷ ..................... C23C 14/32; C23C 16/00
(52) U.S. Cl. .................. 204/192.1; 204/192.12; 204/298.15; 204/298.16; 204/298.23; 204/298.28; 427/128; 427/255.5; 427/571; 118/730
(58) Field of Search ................ 73/864.91, 863.02; 324/750; 204/192.12, 192.2, 298.15, 298.16, 298.23, 298.28, 298.2; 427/128, 255.5, 571; 118/730

(56) References Cited

U.S. PATENT DOCUMENTS 4,689,433 A    8/1987    Foá et al. ................... 568/424

FOREIGN PATENT DOCUMENTS

| JP | 61-288087 | 12/1986 |
|---|---|---|
| JP | 02-133570 | 5/1990 |
| JP | 05-339711 | 12/1993 |
| JP | 07-026378 | 1/1995 |
| JP | 09-036455 | 2/1997 |
| JP | 09-069460 | 3/1997 |
| JP | 09-092906 | 4/1997 |
| JP | 10-162336 | 6/1998 |
| JP | 10-298752 | 11/1998 |
| JP | 11-026230 | 1/1999 |
| JP | 11-229139 | 8/1999 |
| JP | 11-330588 | 11/1999 |
| JP | 11-335821 | 12/1999 |
| JP | 2000-030963 | 1/2000 |

OTHER PUBLICATIONS

*Thermal effects in x-ray masks during synchrotron storage ring irradiation*, J. Vac.Sci.Technol.B 7(6), Nov./Dec. 1989 pp. 1657–1661.

Primary Examiner—Rodney G. McDonald
(74) Attorney, Agent, or Firm—Burns, Doane, Swecker & Mathis, LLP

(57) ABSTRACT

A substrate processing device in which a film is formed on a substrate while a magnetic field, by a magnet arranged in the periphery of a substrate holder, is imparted on to the surface of a substrate mounted on the substrate holder while the substrate holder is rotated, wherein a rotation mechanism for the magnet and a rotation mechanism for the substrate holder are independently provided and controlled and, furthermore, in that it is provided with a device for detection of the magnetic field orientation, a device for detection of the prescribed orientation of the substrate, and a mechanism which, using the output of said two detection devices, affords rotation in which the prescribed direction of the substrate and the direction of the magnetic field are aligned within a prescribed angle.

22 Claims, 8 Drawing Sheets

SUBSTRATE PROCESSING DEVICE AND METHOD

CROSS-REFERENCE TO RELATED APPLICATIONS

The present application claims the priority of Japanese Patent Application No. 2000-233593, filed in Japan on Aug. 1, 2000, the entire contents of which is hereby incorporated herein by reference.

BACKGROUND OF THE INVENTION

1. Field of Industry to Which the Invention Belongs

The present invention pertains to a substrate processing device and processing method and, in particular, it relates to a substrate-processing device in which a film is grown on a substrate while a magnetic field is imparted in a prescribed direction of the substrate.

2. Discussion of Related Art

In recent years, in the field of semiconductors and magnetic films, magnetic heads and recording elements have been proposed which employ a GMR (Giant Magnetoresistive structure) or a TMR (Tunnel Magnetoresistive structure) which generate an MR (Magnetoresistive effect) in which the electric resistance value is significantly altered by an external magnetic field (R&D Research and Development, July 1999, Vol. 41 No. 8 p 14–16).

A brief description of the MR effect will be given with reference to FIG. 3. By way of example, a film comprising the principal GMR structure function has an Fe pin layer 301, Cu spacer layer 302, and IrMn free layer 303. The direction of magnetization of the pin layer 301, which is magnetized in advance in a constant direction 304, is unaltered by the external magnetic field 305. On the other hand, the direction of magnetization 306 of the free layer 303 can be reversed by the external magnetic field 305. In multiple-layer films, the electrical resistance value when the pin layer 301 and the direction of magnetization of the free layer 303 are opposed, as in FIG. 3(b), is different than when they are the same, as in FIG. 3(a). Accordingly, when a voltage is imparted into the multiple-layer film MR, such as shown in FIG. 4, the magnetic data can be detected by the measurement of the resistance values.

Utilizing the anisotropy of the electric resistance, the leakage magnetic field of a magnetic disk is detected and can be used in heads of magnetic disks. In addition, electrical resistance changes are maintained even if there is no electric current flow, so their application as a non-volatile memory (MRAM: Magnetic Random Access Memory) is anticipated.

In reality, these GMR structures are laminated multiple-layer structures of 5 to 9 layers of magnetic and non-magnetic materials and, in the production thereof, by virtue of the fact that the film is grown while a magnetic field is imparted, the pin layer, which is supported in the direction of magnetization, must be magnetized in the one direction.

As is shown in FIG. 5, for the final formation of elements, patterning must be performed with pellets 503 of the MR multi-layer structure aligned with a prescribed direction 502 of the substrate 501. In order to afford the uniformity of the characteristics of these elements within the substrate surface, a magnetic field 504, applied to the elements during growth, must conform with the prescribed direction of the substrate and be imparted uniformly within the substrate surface.

Hitherto, a substrate of diameter 100 mm or 125 mm has been employed for the production of magnetic heads and, as shown in FIG. 6, a magnet has been deployed in the outer circumference of the substrate in such a way that a magnetic field of a prescribed direction parallel with the substrate surface is generated and the film is grown. That is to say, a magnet 603, in which a permanent magnet is assembled, is arranged in the outer circumference of a substrate holder 601 and a substrate 602, and a magnetic field vector 604 is imparted in a constant direction on the substrate surface. The numbers in FIG. 6(b) represent magnetic field strength.

In the case of a magnetic film for MRAM or magnetic heads, a magnetic field of uniform direction must be maintained at all times during growth at ±1.5 degree or less from the prescribed orientation and, if a displacement greater than this occurs, large deviations in the pin layer holding power arise, and a nonuniformity in product performance occurs which markedly lowers the productivity.

On the other hand, because the characteristics of a magnetic device are altered significantly depending on the film thickness, uniformity of film thickness within the substrate surface is extremely important. This is explained with reference to FIG. 7. FIG. 7(a) is a specific example of an MR structure, in which the pin layer is a 2-layer configuration of CoFe 701 and NiFe 702. FIG. 7(b) shows, taking the film thickness of the CoFe layer 701 as 8 nm, the changes in holding power when the film thickness of the NiFe layer 702 was altered from 0.2 to 20 nm. As is shown in the diagram, it can be seen that the holding power was significantly altered even when the film thickness of the NiFe layer was different by just 1 nm. For this reason, when the uniformity of film thickness within the surface is poor, large deviations are generated in the holding power of devices taken from the substrate and the yield is markedly lowered. In this way, the uniformity of film thickness is extremely important in terms of consideration of productivity, and the film thickness distribution within the substrate surface [=(Maximum value−Minimum value)/(Maximum value+Minimum value)] must be ±1.5% or less and, in estimates of the performance of devices of the prior art, it must be suppressed to ±1% or less.

To improve the uniformity of film thickness within the substrate surface, a method exists in which the center axis of an evaporating source is arranged to be offset from the substrate central axis, and the film is grown while the substrate is rotated. This is a method hitherto employed in sputtering methods, vacuum-deposition methods, and MBE (Molecular Beam Epitaxy) (J. Sakai, S. Murakami, et al., J. Vacuum Science and Technology B 1989 p 1657). An example of a configuration of a sputtering device of the prior art employed for the growth of a MR film is shown in FIG. 8.

FIG. 8(a) is a diagram that shows the geometrical position relationship between a substrate 801 and a sputtering target 804. The sputtering target 804, is offset 805 in the outer circumferential direction from a substrate center axis 802, and is fixed at a diagonal angle 806. During film manufacture, the substrate 801 has self-rotation 803 about the substrate center axis 802. FIG. 8(b) shows the film thickness distribution when a film is formed on a substrate of diameter 200 mm using a target of diameter 87.5 mm. The film thickness distribution using a substrate of diameter 200 mm [=(Maximum value−Minimum value)/(Maximum value+Minimum value)] is ±0.45% and, by the employment of an offset-growth method—which involves substrate rotation—an extremely good film thickness uniformity can be obtained even if a comparatively small evaporating source is employed.

It will be noted that, to obtain a good film thickness distribution within the surface without the use of substrate rotation, by way of example, for a substrate of 200 mm a large sputtering target of diameter 450 mm or more is required, and the device costs and material cost are very high. In addition, in the case in which a different type of material is continuously grown while maintaining in vacuum without contaminated gas, a large chamber in which a plurality of large targets are arranged is required and extremely unfavorable conditions, from the point of view of economics, have to be accepted.

Accordingly, using a device in which a large substrate of diameter 125 mm is to be processed, a configuration is adopted in which the substrate is arranged in the approximate center of the chamber, the target center axis is displaced outward from the substrate center axis, and the substrate caused to rotate and, by virtue of this, it is possible for a film thickness distribution within the substrate surface of ±1% or less to be achieved with a comparatively small chamber and a small sputtering target.

Based on the device configuration noted above, by way of example, a device for forming the above-noted GMR structure pin layer is shown in FIG. 2. FIG. 2 is a type cross-sectional diagram that shows a sputtering device for obtaining a uniform magnetic field and good surface film thickness uniformity.

The sputtering device is configured from a stainless steel vacuum chamber 101, in which a target and substrate holder are arranged in the inner part, an exhaust system 102, and a gas supply system 103. In the upper part of the vacuum chamber 101, a substrate holder 105 and magnet 106 are fixed to a support stand 125, and the support stand 125 is linked with a motor 124 by way of a rotating shaft 126. Accordingly, the substrate can be rotated while the orientation of the substrate mounted on the substrate holder relative to the orientation of the parallel magnetic field due to the magnet is maintained constant at all times. It will be noted that, a magnetic fluid seal 110 is employed for the sealing of the rotating shaft. A lift pin 107, which is provided so as to pass through the rotating shaft 126 and the substrate holder 105, is moved vertically by a cylinder 109 when the substrate is carried in and out, and the transfer of the substrate is performed between a robot (not shown in the diagram) and the substrate holder 105. It will be noted that, in the lower end part of the lift pin 107, a bellows 108 is deployed.

On the other hand, the center axis of a target 115, in the upper part of the chamber, is offset from the center axis of the substrate.

A description will be given of the steps for film formation within a magnetic field in which the sputtering device of FIG. 2 is employed.

The chamber 101 is exhausted to a pressure of $5 \times 10^{-7}$ Pa with a Cryo-pump 102, and the rotation shaft 126, when the substrate is transferred from the robot and mounted on the substrate holder 105, is stopped at a position established in advance in such a way that the prescribed direction of the substrate and the direction of the magnetic field are aligned.

The prescribed orientation of the substrate is turned in a load-lock chamber (not shown in the diagram) to be transferred to the robot (not shown in the diagram), and is mounted on the lift pin 107 through a port 104. The lift pin 107 is lowered to mount the substrate 120 on the substrate holder 105. At this time, the direction of the magnetic field due to the magnet 106 and the prescribed direction of the substrate are aligned.

The rotation of the substrate 120, together with the substrate holder 105 and magnet 106, is initiated by the by a rotation motor 124, and this reaches the prescribed rate of rotation of 36 rpm after 150 seconds.

Next, a valve 118 is opened and an Ar gas of a flow amount controlled by a flow meter, not shown in the diagram, is introduced. A DC voltage from a DC power source (not shown in the diagram) is imparted to a sputtering target 115 and the Ar gas is excited to generate plasma. After a few seconds, when the plasma has stabilized, a shutter 116 is opened by a shutter drive mechanism 117, and the growth of film on the substrate is initiated. The shutter 116 is closed using time control and the growth is stopped. DC voltage to the target is interrupted and, simultaneously, electric current to the rotation motor 124 is interrupted. The rate of rotation of the substrate 120 is gradually lowered and, after approximately 150 seconds, the rotation of the substrate 120 is stopped. At this time, using a sensor or the like fixed to the substrate rotating mechanism, the substrate is turned to a prescribed orientation and stopped.

The lift pin 107 is raised and the substrate recovered by the robot. Then an unprocessed substrate is mounted on the lift pin and the same process is repeated.

As is described above, the substrate is arranged to conform with the orientation of the magnet within a range of ±1.5 or less, and the substrate and magnet must be synchronized and rotated at a rate of rotation of, at least 30 rpm, and normally 36 rpm. However, by way of example, even in the case of a magnet which generates, in a substrate diameter of 200 mm, a parallel magnetic field of minimum magnetic field strength 0.064 A/m (500e), and is formed in a ring-shape by a method in which powerful permanent magnets—presently marketed—pull against each other, the magnitude thereof is one of, at the least, an inner diameter of 430 mm, outer diameter of 480 mm and height of 40 mm, and the weight thereof reaches 18 kg.

For this reason, in the configuration of the device of the prior art shown in FIG. 2, a magnet of external diameter 480 mm, weight 18 kg and inertial momentum 3.8 kg m² must be stopped and rotated for each processed substrate. It takes 150 seconds, which constitutes a long time, from stoppage until steady rotation, and this factor hinders improvements to productivity. In addition, there are problems in that a heavy load is placed on the bearings and the like of the rotation shaft at each rotation and stoppage of said magnet, and the device life span and accompanying maintenance cycle are short.

OBJECTS AND SUMMARY

An objective of the present invention, which resolves the above-noted problems of the prior art, is to provide, in a substrate processing device and substrate processing method in which growth of a film is continuously performed by rotation of a substrate while imparting a magnetic field in a prescribed direction of the substrate, a substrate processing device and substrate processing method in which, even using a large substrate, by way of example 150 mm, the time taken to reach steady rotation of the substrate is shortened, productivity is improved, and a longer life span is achieved.

In a substrate processing device of the present invention, a film is grown on a substrate while a magnetic field, by a magnet arranged in the periphery of a substrate holder, is imparted on to the surface of a substrate mounted on said substrate holder while said substrate holder is rotated. A rotation mechanism for the abovementioned magnet and a rotation mechanism for the abovementioned substrate holder are independently provided. Furthermore, the substrate processing device is provided with a means for detection of the abovementioned magnetic field orientation, a means for detection of the prescribed orientation of the abovementioned substrate, and a mechanism which, using the output of the two detection means, affords rotation in which the prescribed direction of the abovementioned substrate and the direction of the abovementioned magnetic field are aligned within a prescribed angle.

In one embodiment of the present invention, encoders are provided in the rotation mechanism of the abovementioned magnet and in the rotation mechanism of the abovementioned substrate holder and are employed as a means for detection of the direction of the abovementioned magnetic field and a means for detection of the prescribed direction of the abovementioned substrate. When rotation is performed with the prescribed direction of the abovementioned substrate and the direction of the abovementioned magnetic field aligned within a prescribed angle, a mechanism is activated to bring the rotation parts of the abovementioned magnet and the abovementioned substrate holder into proximity and contact with each other. And, a mechanism in which at least one pair of protruding members attached to said rotations parts are brought into contact in the direction of rotation.

In this way, a configuration is adopted in which a rotation mechanism for the magnet and substrate holder are independently provided and independently controlled, and the magnet, which is large and heavy and has a large inertial momentum, is rotated at all times at a prescribed rate of rotation and, when the substrate is to be exchanged, only the substrate holder, which is light and has a small inertial momentum, is stopped and rotated. Thus, the time taken to reach stoppage and to reach a steady rotation of the substrate can be markedly shortened. As a result, it is possible for the time required for exchange of the substrate to be shortened and for the throughput of the device to be significantly improved.

Furthermore, because the substrate holder is light in weight, there is almost no burden placed on the bearings and the like during rotation and the life span of the device is extended.

Furthermore, in one embodiment of the present invention, the substrate holder is caused to be rotated by an induction magnetic field generated by the rotation of the abovementioned magnet. When the substrate holder is configured using a conducting material such as aluminium, because the substrate holder is automatically rotated due to the effect of the induction magnetic field generated by the rotation of the magnet, the motor and the like used for substrate rotation can be omitted, and a simplification of the configuration of the device is possible. In addition, it is preferable that at least one coil, vertical with respect to the substrate surface, be arranged in the outer circumferential surface part of the abovementioned substrate holder and, by virtue of this, an even larger induction magnetic field is obtained and the time taken to reach a steady rotation of the substrate holder can be shortened.

In a substrate processing method of the present invention, a film is grown on a substrate while a magnetic field, by a magnet arranged in the periphery of a substrate holder, is imparted on to the surface of a substrate mounted on said substrate holder while said substrate holder is rotated. The abovementioned magnet is continuously maintained in the rotation state at all times and, when the substrate is to be exchanged, exchange of the substrate is performed with only the rotation of the abovementioned substrate holder stopped. When the abovementioned substrate holder is rotated again and the direction of the abovementioned magnetic field and the prescribed direction of the abovementioned substrate are within a prescribed angle, rotation parts of the abovementioned magnet and the abovementioned substrate holder are brought into contact with each other to afford integral rotation of the abovementioned magnet and substrate holder, following which the growth of the film is performed.

In addition, in one embodiment of the present invention, the abovementioned substrate holder is caused to be rotated by an induction magnetic field generated by the rotation of the abovementioned magnet.

DETAILED DESCRIPTION OF THE PREFERRED EMBODIMENTS

Figure 1:
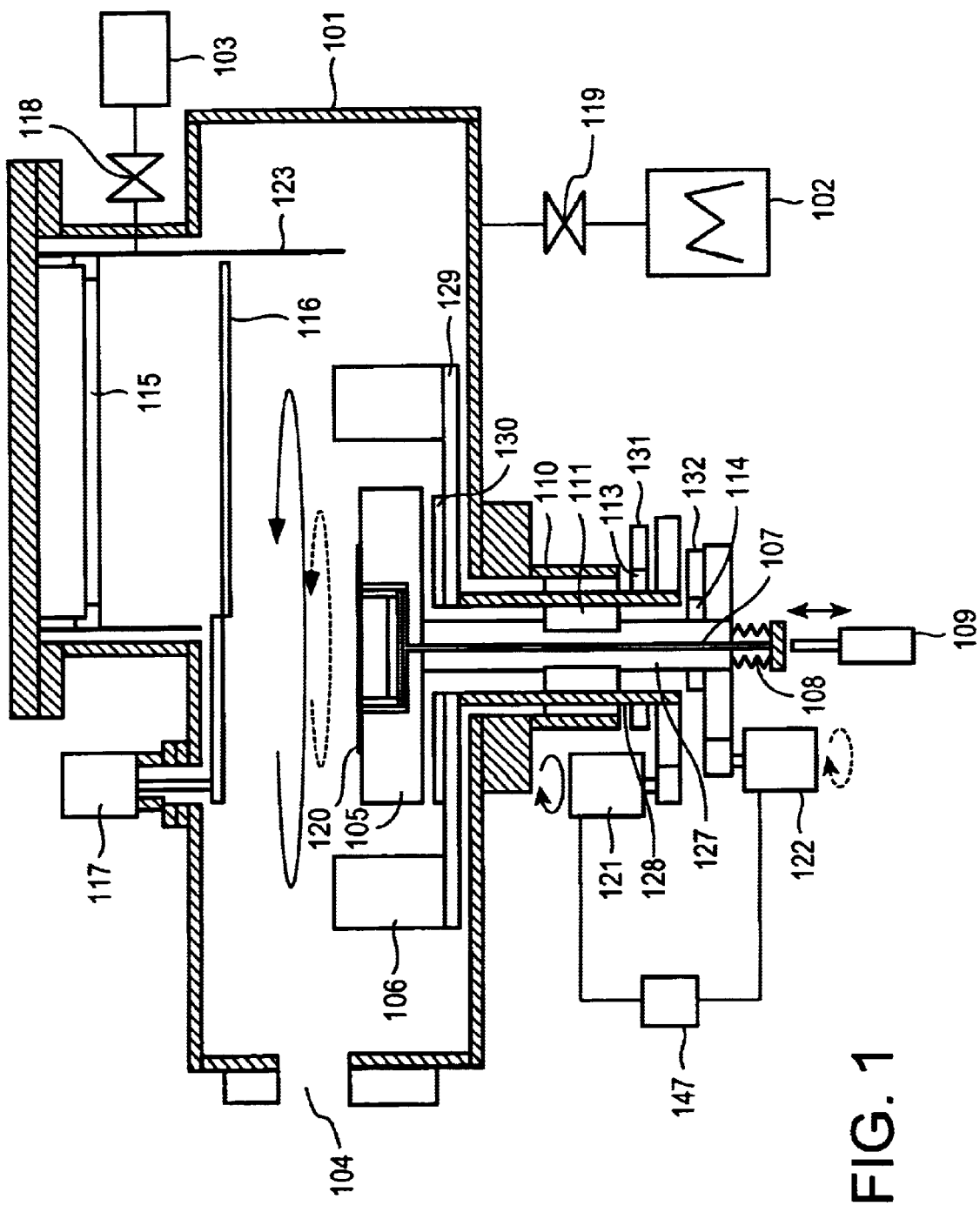
FIG. 1 is a cross-sectional diagram of a substrate-processing device pertaining to an embodiment of the present invention.

An example of a configuration of the substrate-processing device of the present invention is shown in FIG. 1. FIG. 1 is a cross-sectional diagram that shows a sputtering device which comprises a substrate rotating mechanism and magnet rotating mechanism for obtaining a uniform magnetic field and good film thickness distribution within the surface.

Figure 2:
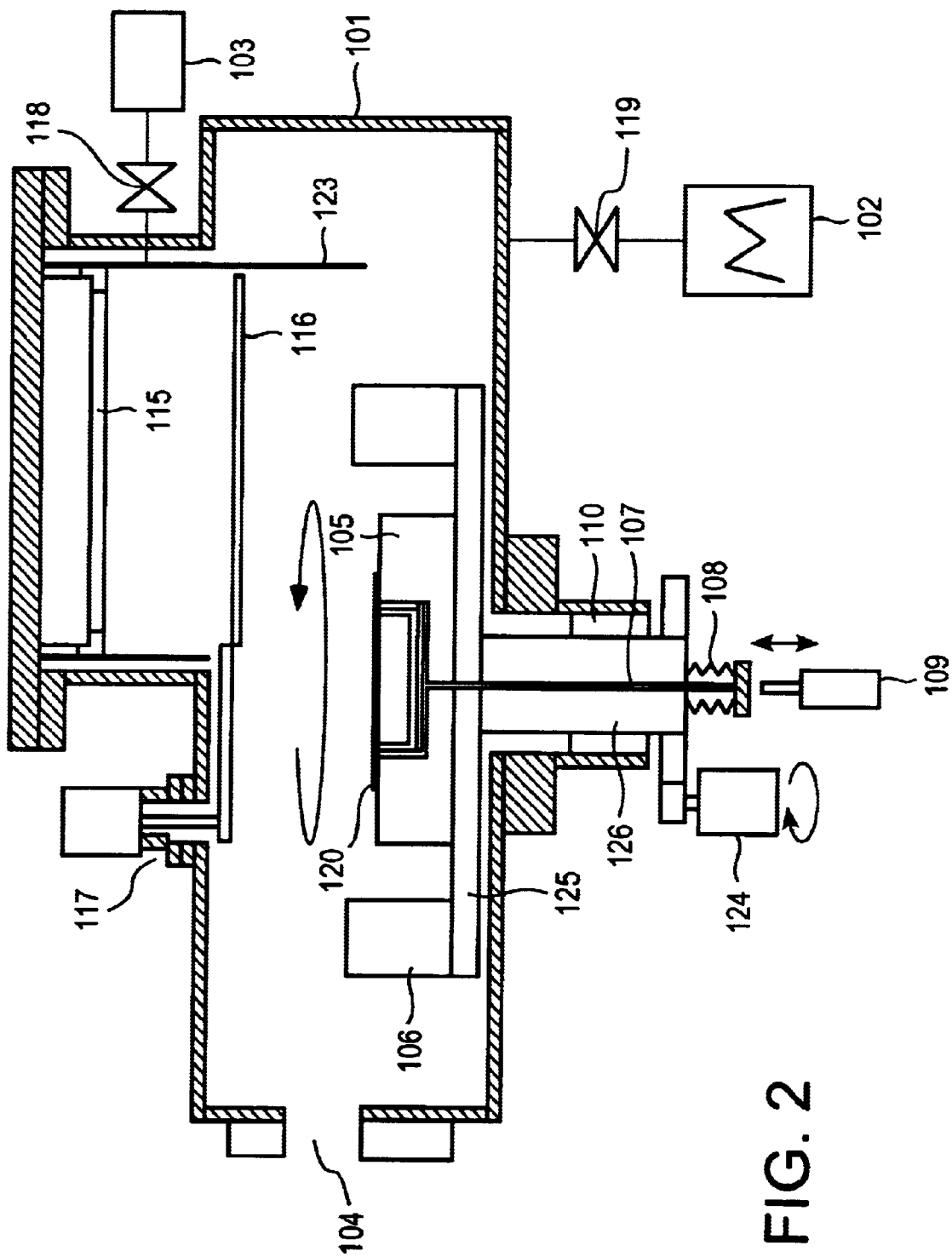
FIG. 2 is a cross-sectional diagram of a substrate-processing device of the prior art.
Figures 3A, 3B:
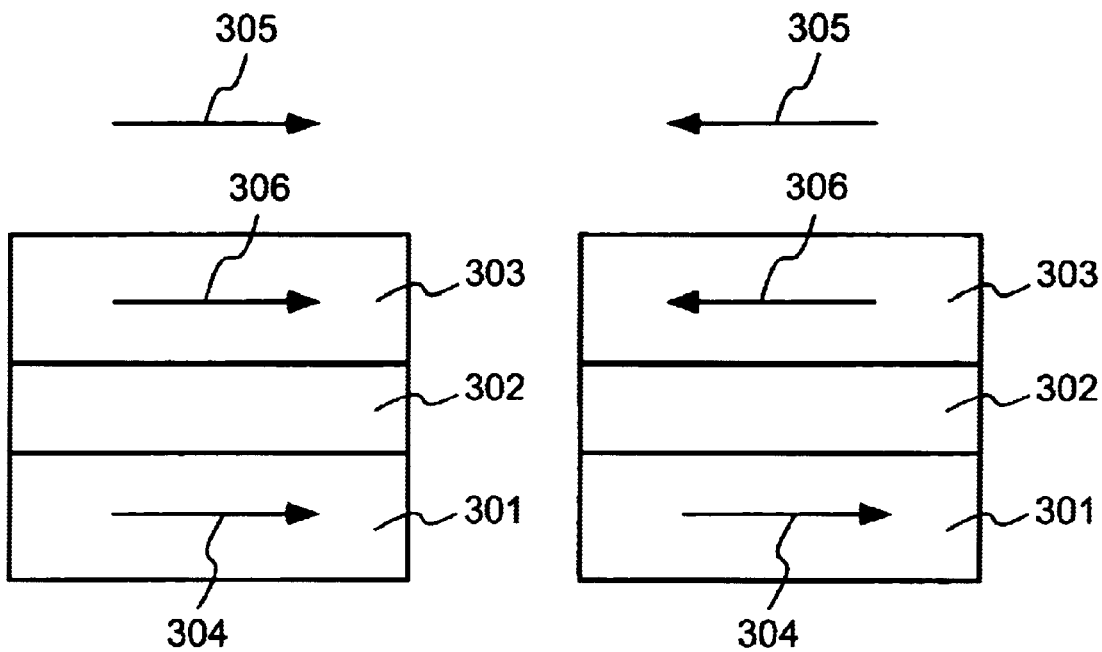
FIGS. 3(a) and 3(b) are operational diagrams of magnetic resistant elements.
Figure 4:
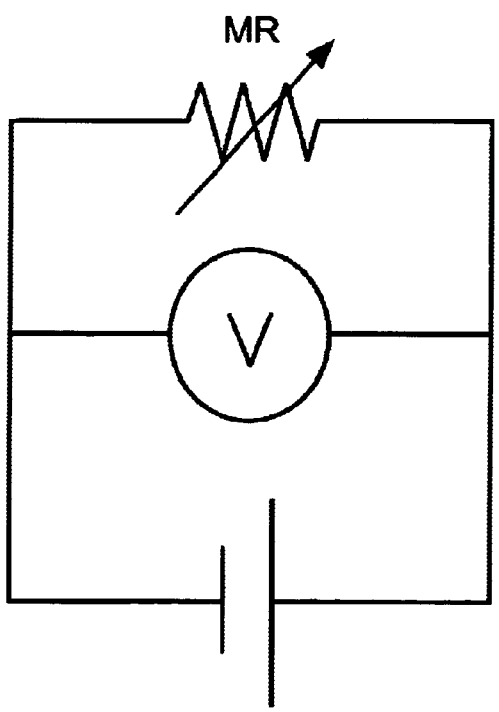
FIG. 4 illustrates a resistance value measurement circuit of the magnetic resistant elements.
Figure 5:
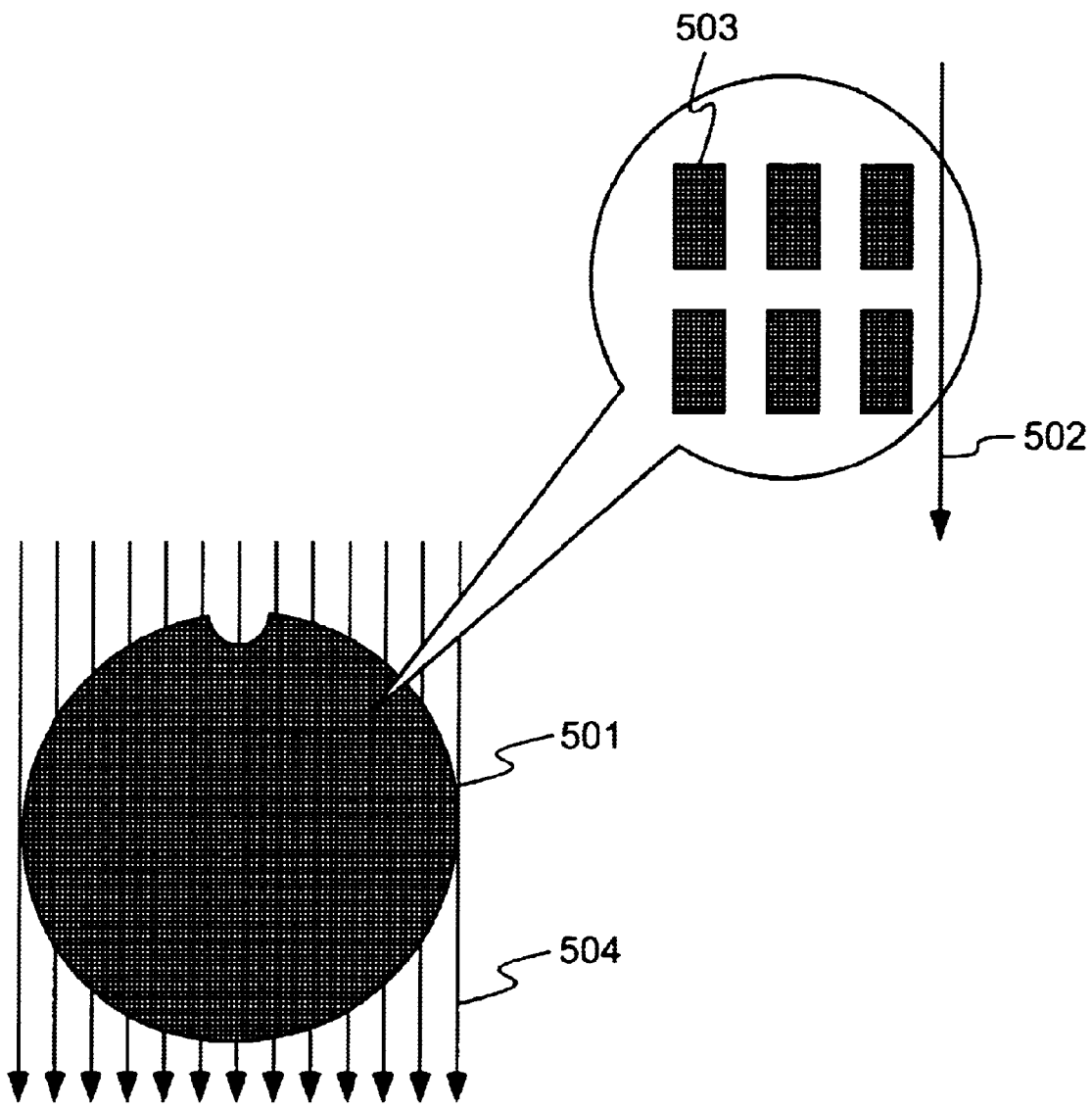
FIG. 5 is a diagram that shows the imparted magnetic field on the substrate and an arrangement of the magnetic resistant elements.
Figure 6A:
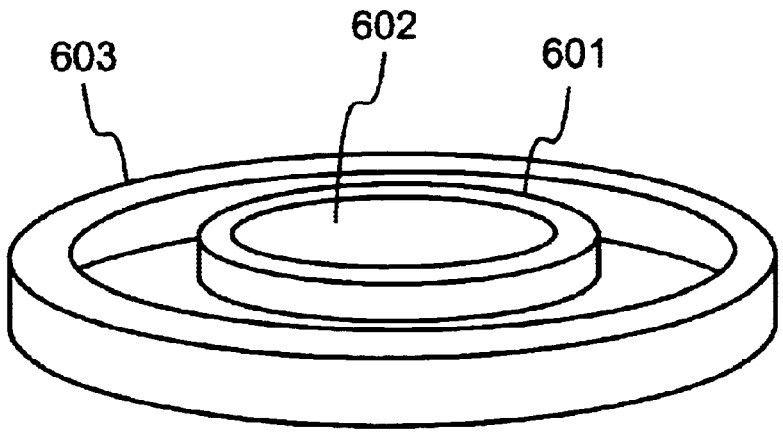
FIGS. 6(a) and 6(b) are diagrams that show the arrangement of the substrate and magnet and the substrate holding device.
Figure 6B:
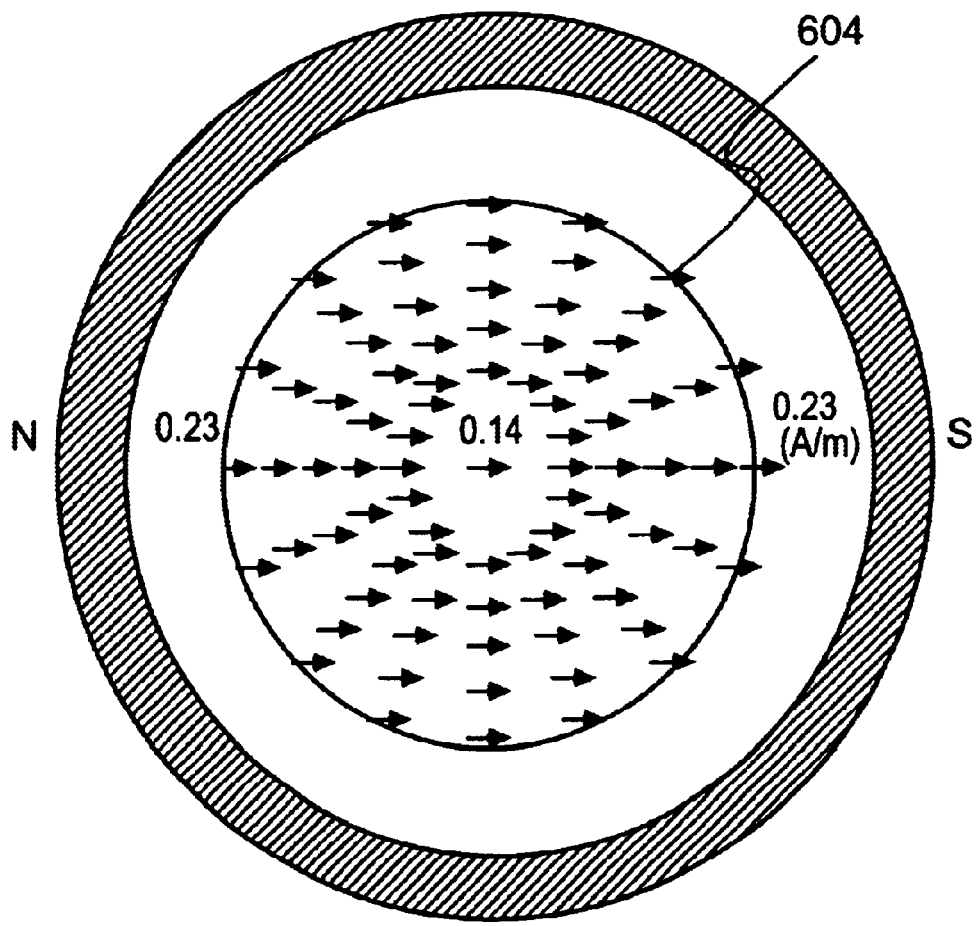
Figure 7A:
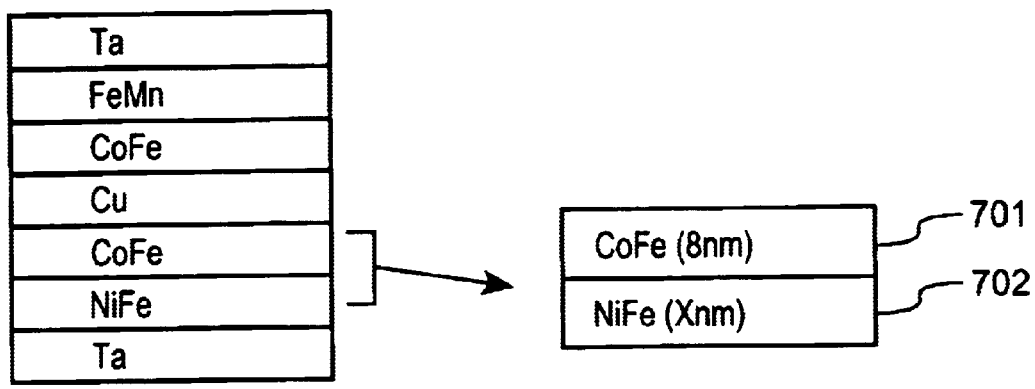
FIG. 7(a) is a diagram that shows the MR structure and FIG. 7(b) is a graph that shows the dependency between the NiFe film thickness and the holding power.
Figure 7B:
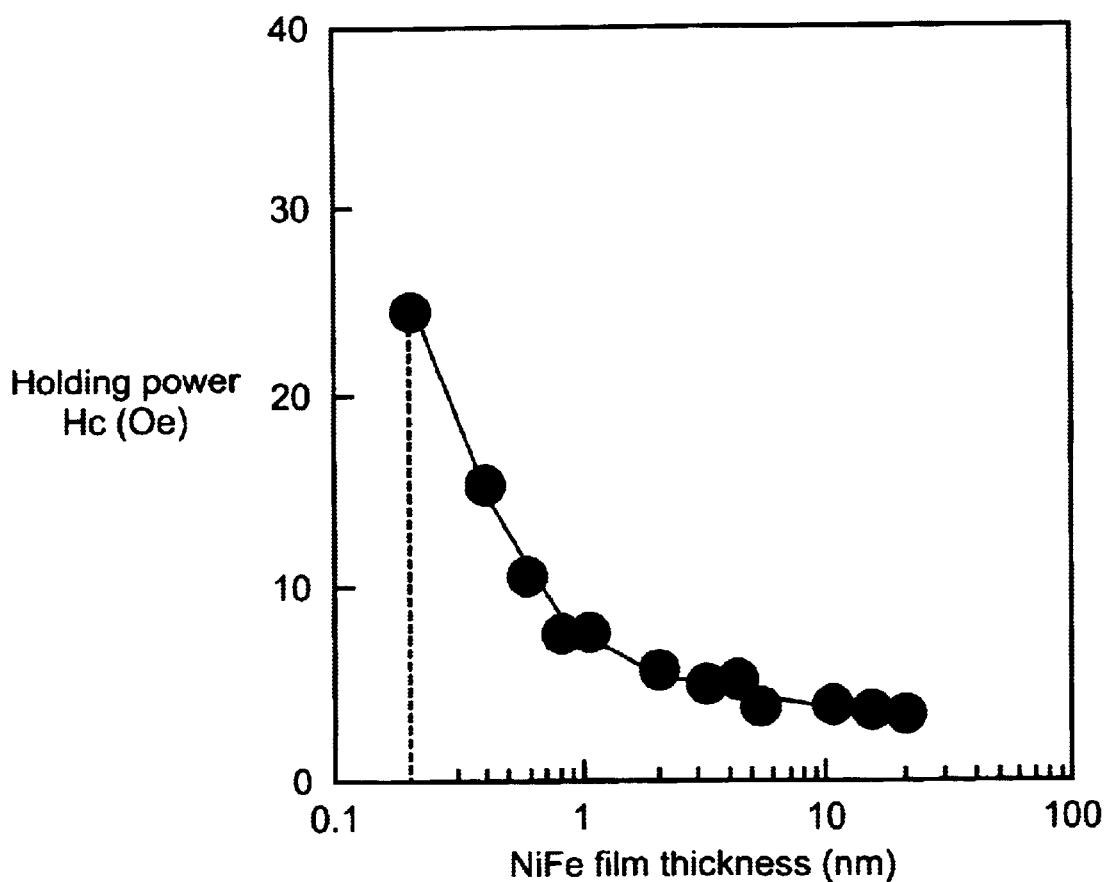
Figure 8A:
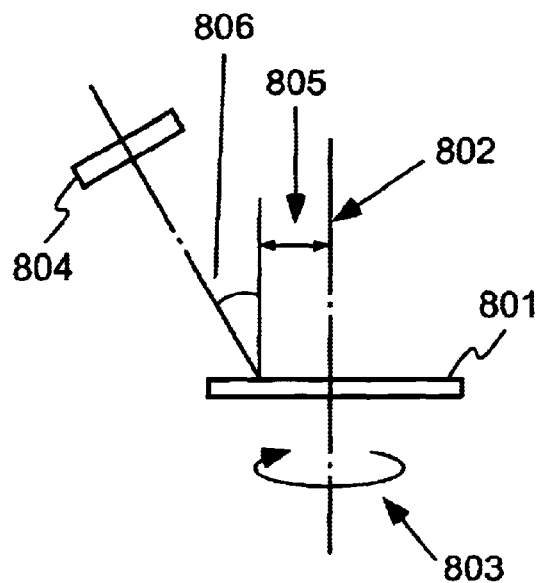
FIG. 8(a) is a diagram that shows the geometrical arrangement of the substrate and sputtering target.
Figure 8B:
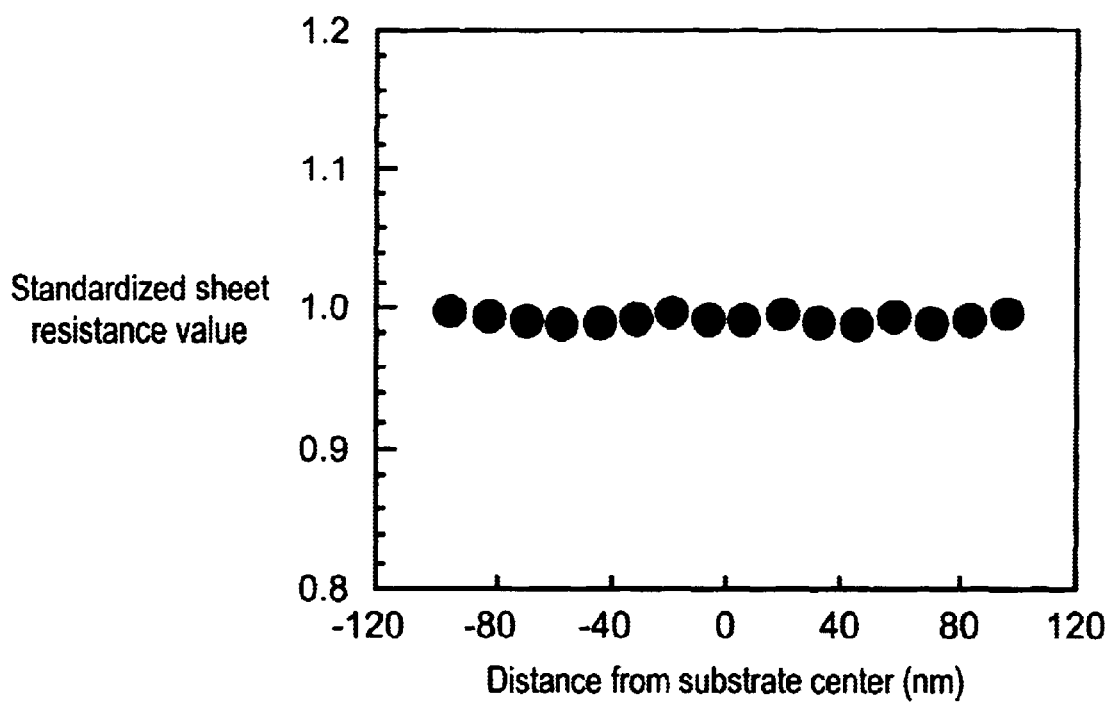
FIG. 8(b) is a graph that shows the substrate film thickness distribution.

The configuration of the sputtering device of FIG. 1 is essentially, with the exception of the rotation mechanisms for the substrate holder and the magnet, the same as the sputtering device shown in FIG. 2. Accordingly, by the provision of the rotating mechanisms of the present invention, a sputtering device with improved productivity and with longer life span can be realized.

As is shown in the diagram, the rotating mechanism of the substrate holder and the rotating mechanism of the magnet are provided and controlled independently. That is to say, a substrate holder 105 is fixed on a rotation shaft 127, and is rotated by a motor 122. On the other hand, the magnet 106, for forming a parallel magnetic field on the substrate surface that is uniform in one direction and parallel to the substrate surface, is fixed to a support stand 129 and is rotated by a motor 121 by way of a rotating shaft 128. A control means 147 is provided for independently controlling the motor 121 and the motor 122. Encoder magnetic rings 114, 113 are fixed in the rotation shafts 127, 128, respectively. The orientation of the magnetic field and the orientation of the substrate, and the respective number of rotations of each, are detected by encoder magnetic detectors 131, 132 provided in the outer circumferential surface thereof. The output of the detectors 131, 132 is sent to the control means 147. The configuration of the lift pin 107 is, provided in such a way as to pass through an inner part of the rotation shaft 127 and the substrate holder 105, in the same way as in FIG. 2.

An uneven member 130, which has the action of a shoe and comprises a large number of uneven parts, is provided in the circumferential direction on the upper surface section of the magnet holder 129 opposing the base surface of the substrate holder 105. By the bringing into contact the uneven member 130 with the substrate holder base surface, the two are able to be integrally rotated. That is to say, when the rate of rotation of the substrate holder is increased to approach the rate of rotation of the magnet, and when the orientation of the substrate and the magnet, based on the output of the encoders, are within a prescribed angle, the entire magnet rotation mechanism is lifted by a drive mechanism, not shown in the diagram, to bring the uneven member and substrate holder surface into contact with each other. As a result, it is possible for the substrate to be rotated while maintaining a state in which the orientation of the magnet and substrate are aligned within a prescribed angle.

Next, with reference to the embodiment illustrated in FIG. 1, a description will be given of the steps in which the substrate is carried in from a load-lock chamber (not shown in the diagram), mounted on the substrate holder, film growth performed thereon in a magnetic field, and then carried out to a load lock chamber.

A chamber 101 is exhausted to a pressure of $5 \times 10^{-7}$ Pa by a Cryo-pump 102. A magnet 106 is rotated in advance at a prescribed rate of rotation (by way of example 36 rpm) by a magnet rotation motor 121. Meanwhile, the substrate holder 105 is turned in a specified direction and stopped, and the lift pin 107 is in a raised state.

The substrate is turned in a prescribed direction in the load-lock chamber, is transferred by the robot passing through a port 104, and is mounted on the lift pin 107 of the substrate holder 105. Next, the lift pin 107 is lowered and the substrate 120, with the prescribed direction thereof in a constant relationship with the orientation of the substrate holder, is mounted on the substrate holder 105.

The rotation of the substrate holder 105 is initiated by a substrate rotation motor 122 and, after approximately 22 seconds, 36 rpm, which is the same rate of rotation as the magnet, is reached. The orientation of the magnetic field and the orientation of the substrate are monitored by the encoders 113, 114 throughout and, at the appropriate stage, when the substrate holder 105 approaches 36 rpm, the whole magnet rotation mechanism is lifted by a drive mechanism (not shown in the diagram) and brought into contact in such a way that the orientation of the two are aligned. By virtue of this, the substrate holder and magnet rotate integrally and rotation is performed in a state in which the rate of rotation of both are synchronous and the orientation thereof is aligned. As a result, it is possible for the growth of the film to be performed in a state in which a magnetic film is applied in a prescribed direction of the substrate.

Next, the valve 118 is opened and an Ar gas of a prescribed flow amount is introduced. A DC voltage is imparted to the sputtering target 115, and the Ar gas is excited to generate plasma. After several seconds, following stabilization of the plasma, the shutter 116 is opened and the growth of film on the substrate is initiated. The shutter 116 is closed using time control and the growth of film is stopped. The DC voltage is interrupted and, simultaneously, by the control of the substrate rotation motor 122, the rate of rotation of the substrate 120 is lowered and, after approximately 22 seconds, the rotation is stopped. At this time, the substrate holder is stopped by the output of the encoder 114 in such a way that the substrate is oriented in the prescribed direction.

During this time, the magnet 106 is continually rotated at the constant rate of rotation of 36 rpm. The lift pin 107 is raised and the substrate 120 is lifted up and recovered by the robot.

Although the processing of one substrate is completed in the manner described above, the same process is repeated continuously whereby the next unprocessed substrate is mounted on the substrate holder by the robot.

As described above, according to one aspect of the present invention, a state is maintained in which the magnet is rotated at all times at a constant rotational speed during growth, and in that the growth of the film is repeated with only the substrate holder being caused to stop and rotate.

Figure 9:
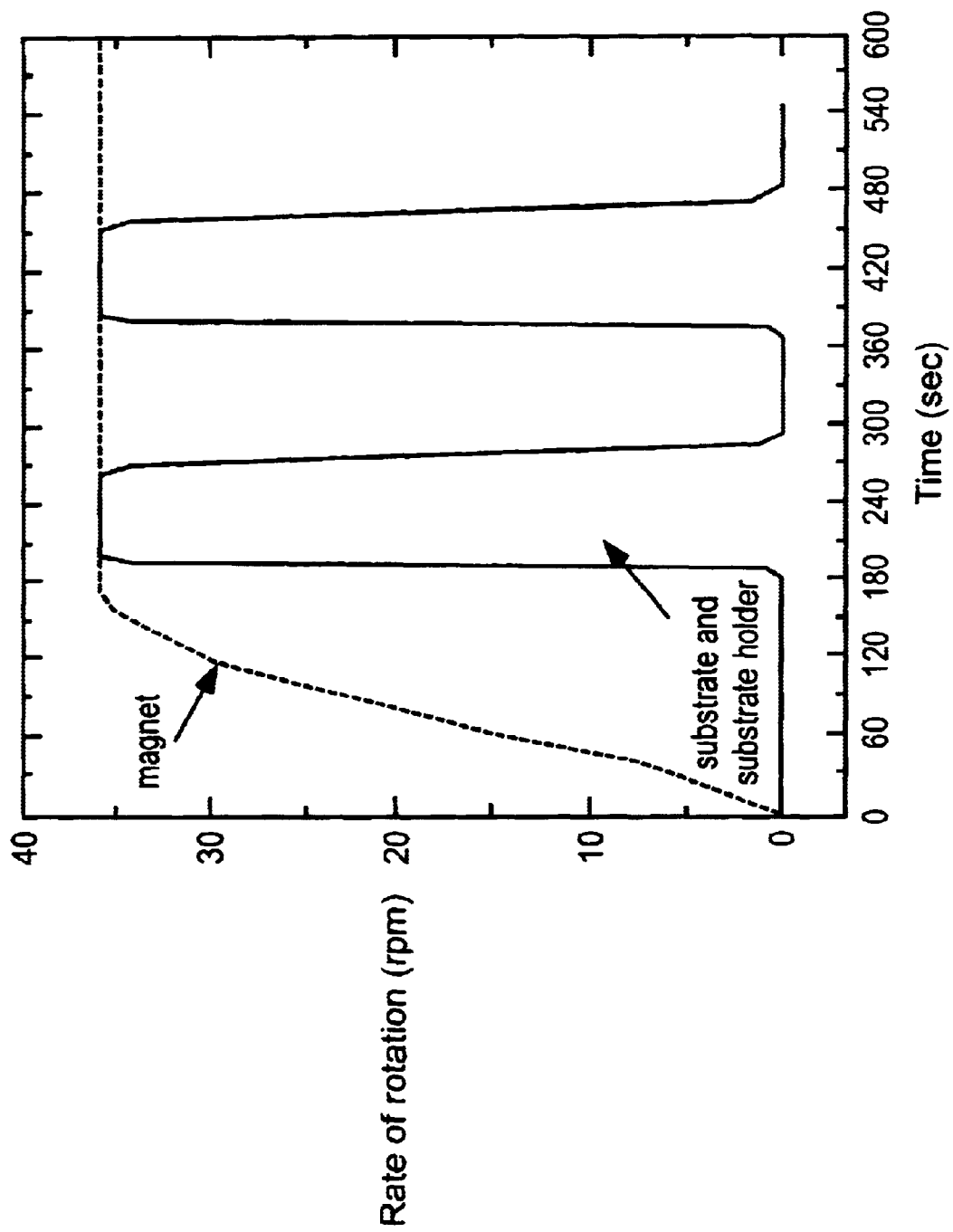
FIG. 9 is a graph that shows the time path of the number of rotations and the rotation of the magnet and substrate based on the present invention.

Accordingly, employing this method, only a substrate and a substrate holder of weight 2 kg, diameter 299 mm and inertial momentum 0.02 $kgm^2$ are stopped and rotated. As shown by the straight line in FIG. 9, the time required for rotation and stoppage can be markedly shortened. That is, the time taken from steady rotation of the substrate to stoppage is 22 seconds, and the time taken from stoppage to steady rotation is 24 seconds. By the adoption of the present invention, compared to the 155 seconds required in the prior art from the excitation of the magnet until steady rotation (broken line of FIG. 9), the throughput is improved and the productivity is markedly improved. Furthermore, the present invention is advantageous in that, not only is the time required for stoppage and rotation shortened, but additionally, because the load placed on the bearings is significantly lightened, the system has a long life span—shown by the straight line—equivalent to many of the substrate processing devices of the prior art.

There are no special limitations to the materials of the substrate holder in the present invention and, any kind of material may be employed, in an investigation of various device configurations carried out by the inventors of the present invention, it was confirmed that, when a substrate holder using aluminium was produced, the substrate holder was automatically induction rotated by the electric flow generated in the substrate holder by the rotation of the magnet. For this reason, it is possible to perform rotation control of the substrate holder just by using the free rotation of the substrate holder and providing a rotation stopping mechanism. In such an embodiment, the motor for substrate holder rotation can be omitted. In this case, as is described above, the support stand and so on of the substrate holder and magnet should be brought into contact at the point at which the rate of rotation of the substrate holder approaches the rate of rotation of the magnet, wherein synchronous rotation can be achieved in the same way.

In this embodiment, it is preferable that a coil be embedded in the substrate holder inner part in order to increase the effect of the induction magnetic field. By way of example, the effect of the induction magnetic field can be increased by the arrangement of one or a plurality of coils vertical with respect to the substrate surface in the external surface side of the substrate holder. In addition, it is possible to increase and decrease the induction magnetic field by opening and closing the circuit of this coil.

Although a description has been given of a mode of the embodiment of the present invention with reference to FIG. 1, the configuration, mechanism, means, members and so on of the present invention are not limited to the that of FIG. 1, and provided they have similar performance, any may be employed.

By way of example, in the embodiment of FIG. 1, although a configuration is adopted in which an uneven member 130 is provided in the magnet holder and the entire magnet rotation mechanism is raised to afford contact therewith in order that the rate of rotation between the substrate and magnet is synchronized and the orientation is aligned, the uneven member 130 may be provided in the base surface of the substrate holder. Or, it may be provided in both the substrate holder surface and the magnet holder surface. In addition, instead of raising the magnet rotation mechanism to bring the two into contact, the substrate rotation mechanism may be lowered.

Furthermore, in addition to said uneven member, by way of example, at least one pair of protruding members may be provided in the substrate holder surface and support stand in such a way that, when the magnet rotation mechanism is raised, the side surfaces thereof are brought into contact in the direction of rotation. In this case, the protruding members are provided in a position in which, at the time of abutment, the prescribed direction of the substrate and the direction of the magnetic field are aligned. In this way, at the point at which the orientation of the magnet and the substrate are, based on the output of the encoders, aligned, by the lifting of the magnet rotation mechanism to bring both protruding members into contact, the substrate holder and magnet can be caused to be integrally rotated. It will be noted that, various shapes and arrangements of protruding members such as this may be adopted, by way of example, a fit-in shape may be used.

Also, sections in which the substrate holder and magnet rotation parts are brought into contact are not limited to the above-noted substrate holder surface and support stand upper surface and, by way of example, a rotation shaft part on the atmospheric side may be used.

In addition, although a ring-shaped magnet is employed as the magnet for generating the parallel magnetic field, it is not limited thereto, by way of example, a pair of rod-shaped magnets may be employed and, in addition, provided the encoder is able to detect the number of rotations and the orientation (rotational angle), it goes without saying that, irrespective of whether it is a magnetic method, any method, such as an optical method, may be employed.

In addition, although the present invention is described as a device in which a sputtering target is employed in the above-noted embodiment mode, it is clear that, without citing an example, the same effect will be obtained with a heat-evaporating source and ion-beam sputtering device.

By the constant rotation of a magnet which imparts a magnetic field in a prescribed direction of the substrate, the stopping of the substrate and substrate holder for transportation of the substrate, and the synchronous rotation for film growth in which the direction of the substrate is aligned with the magnetic field, the present invention, as is described above, affords the processing of substrates one after the other, without the need to rotate and stop the magnet, which is large and heavy, on each occasion that a substrate is transported. As a result, because the stopping time of rotation is inverse to the inertial momentum of the magnet, the time for excitation rotation can be shortened. Therefore, it is possible for productivity to be improved. Furthermore, the invention has the effect of lowering the external load placed on the rotation motor and rotation bearings which afford the rotation of the magnet, and this contributes to a lengthening of the life span of the device and the maintenance cycle.

In addition, by the adoption of a configuration of a substrate holder using an appropriate conductive material, it is possible to rotate the substrate and substrate holder using a magnetic field inducted on the substrate holder by the magnetic field of a rotating magnet.

Although the present invention has been described in connection with exemplary embodiments thereof, it will be appreciated by those skilled in the art that additions, deletions, modifications, and substitutions not specifically described may be made without departing from the spirit and scope of the invention as defined in the appended claims.

In the claims:

1. A substrate processing device for forming a film on a surface of a substrate, the substrate processing device comprising:
   a substrate holder;
   a magnet deployed in a periphery of the substrate holder so as to impart a magnetic field on to the surface of a substrate mounted on the substrate holder;
   a substrate holder rotation mechanism; and
   a magnet rotation mechanism;
   wherein the magnet rotation mechanism and the substrate rotation mechanism are configured so as to be able to be rotated independently of each other, and the substrate holder rotation mechanism is controlled independently of the magnet rotation mechanism.

2. The substrate processing device of claim 1, further comprising means for releasably and selectively engaging the substrate holder rotation mechanism with the magnet rotation mechanism so as to enable the magnet and the substrate holder to rotate in unison.

3. The substrate processing device of claim 1, further comprising detectors for detecting an orientation of the magnet and an orientation of the substrate holder.

4. The substrate processing device of claim 2, further comprising detectors for detecting an orientation of the magnet and an orientation of the substrate holder.

5. The substrate processing device of claim 4, wherein the engaging means engages the substrate holder rotation mechanism with the magnet rotation mechanism when the orientation of the magnet is aligned with the orientation of the substrate holder within a prescribed angle.

6. The substrate processing device of claim 3, wherein the detectors are encoders.

7. The substrate processing device of claim 5, wherein the detectors are encoders.

8. The substrate processing device of claim 1, wherein the substrate holder rotation mechanism enables rotation of the substrate holder by an induction magnetic field generated by rotation of the magnet.

9. The substrate processing device of claim 8, further comprising at least one coil, vertical to the substrate holder, in an outer circumferential side surface of the substrate holder.

10. The substrate processing device of claim 1, wherein each of the substrate holder rotation mechanism and the magnet rotation mechanism includes a motor.

11. The substrate processing device of claim 1, further comprising control means for controlling the substrate holder rotation mechanism and the magnet rotation mechanism so as to:
   continuously maintain the magnet in a rotation state, and when the substrate is to be exchanged, stopping rotation of the substrate holder while continuously maintaining the magnet in a rotation state and rotating the substrate holder again after exchanging the substrate, and when a direction of the magnetic field and a prescribed direction of the substrate are within a prescribed angle, rotating the magnet and the substrate holder in unison.

12. The substrate processing device of claim 11, wherein when the direction of the magnetic field and the prescribed direction of the substrate are within the prescribed angle, rotating parts of the magnet and the substrate holder are brought into contact with each other to rotate the magnet and substrate holder in unison.

13. A substrate processing device for forming a film on a surface of a substrate, the substrate processing device comprising:

a substrate holder;

a magnet deployed in a periphery of the substrate holder so as to impart a magnetic field on to the surface of a substrate mounted on the substrate holder;

a substrate holder rotation mechanism;

a magnet rotation mechanism that is rotatable independently of the substrate holder rotation mechanism;

a first detector for detecting an orientation of the magnet;

a second detector for detecting an orientation of the substrate; and a control device for controlling rotation of the substrate holder rotation mechanism and the magnet rotation mechanism so that a substrate on the substrate holder and the magnet are aligned with each other within a prescribed angle.

14. The substrate processing device of claim 13, further comprising means for releasably and selectively engaging the substrate holder rotation mechanism with the magnet rotation mechanism so as to enable the magnet and the substrate holder to rotate in unison.

15. The substrate processing device of claim 13, wherein the detectors are encoders.

16. The substrate processing device of claim 13, wherein the substrate holder rotation mechanism enables rotation of the substrate holder by an induction magnetic field generated by rotation of the magnet.

17. The substrate processing device of claim 16, further comprising at least one coil, vertical to the substrate holder, in an outer circumferential side surface of the substrate holder.

18. The substrate processing device of claim 13, wherein each of the substrate holder rotation mechanism and the magnet rotation mechanism includes a motor.

19. A substrate processing method in which a film is formed on a substrate while a magnetic field, generated by a magnet deployed in a periphery of a substrate holder, is imparted on to a surface of the substrate mounted on said substrate holder while said substrate holder is rotated, comprising the steps of:

continuously maintaining the magnet in a rotation state and, when the substrate is to be exchanged, stopping only the rotation of the substrate holder and, rotating the substrate holder again and when a direction of the magnetic field and a prescribed direction of the substrate are within a prescribed angle, the rotation parts of the magnet and the abovementioned substrate holder are brought into contact to afford the integral rotation of the magnet and substrate holder, following which the forming of the film is performed.

20. The method of claim 19, wherein the substrate holder is rotated by an induction magnetic field generated by the rotation of the abovementioned magnet.

21. A substrate processing method, comprising the steps of:

continuously rotating a magnet in a periphery of a substrate holder to create a magnetic field;

placing a substrate on the substrate holder while the substrate holder is stationary and the magnet is rotating;

rotating the substrate holder to the same rate of revolution as the magnet;

bringing an orientation of the substrate holder and the magnet into alignment with each other;

engaging the substrate holder and the magnet with each other to enable the substrate holder and magnet to rotate in unison;

forming a film on the substrate while the substrate holder and magnet are rotating in unison;

disengaging the substrate holder and magnet from each other;

stopping rotation of the substrate holder while continuing rotation of the magnet; and removing the substrate from the substrate holder.

22. The method of claim 20, wherein the substrate holder is rotated by an induction magnetic field generated by the rotation of the abovementioned magnet.

* * * * *